(12) United States Patent
Soininen et al.

(10) Patent No.: US 11,214,866 B2
(45) Date of Patent: Jan. 4, 2022

(54) NOZZLE HEAD AND APPARATUS (71) Applicant: BENEQ OY, Espoo (FI)

(72) Inventors: Pekka Soininen, Espoo (FI); Mika Jauhiainen, Espoo (FI)

(73) Assignee: BENEQ OY, Espoo (FI)

( * ) Notice: Subject to any disclaimer, the term of this patent is extended or adjusted under 35 U.S.C. 154(b) by 0 days.

(21) Appl. No.: 17/066,724

(22) Filed: Oct. 9, 2020

(65) Prior Publication Data

US 2021/0025057 A1 Jan. 28, 2021

Related U.S. Application Data (63) Continuation of application No. PCT/FI2019/050294, filed on Apr. 11, 2019.

(30) Foreign Application Priority Data

Apr. 12, 2018 (FI) ..................................... 20185351

(51) Int. Cl.
*C23C 16/455* (2006.01)
*B05B 1/00* (2006.01)

(52) U.S. Cl.
CPC ........ *C23C 16/45551* (2013.01); *B05B 1/005* (2013.01); *C23C 16/45563* (2013.01)

(58) Field of Classification Search
CPC ........ C23C 16/45563; C23C 16/45578; C23C 16/54
See application file for complete search history.

(56) References Cited

U.S. PATENT DOCUMENTS 6,089,472 A * 7/2000 Carter ................... C23C 16/455
239/422
2004/0216668 A1 11/2004 Lindfors et al.
2006/0011298 A1 * 1/2006 Lim ................... C23C 16/45574
156/345.34

(Continued)

FOREIGN PATENT DOCUMENTS

CN 102424956 A 4/2012
CN 105839079 A 8/2016

(Continued)

OTHER PUBLICATIONS

Finnish Search Report issued by the Finnish Patent and Registration Office in relation to Finnish Application No. 20185351 dated Oct. 24, 2018 (2 pages).

(Continued)

*Primary Examiner* — Joseph A Miller, Jr.
(74) *Attorney, Agent, or Firm* — Robert P. Michal, Esq.; Carter, DeLuca & Farrell LLP (57) ABSTRACT A nozzle head and an apparatus for subjecting a surface of a substrate to successive surface reactions of at least two precursors according to the principles of atomic layer deposition, the nozzle head includes a nozzle head body, a nozzle head output face and gas channels for transporting gas. The nozzle head further includes a first through hole through at least two of the two or more nozzles and a first tube having a tube wall and being fitted into the first through hole, said first tube including gas conduits provided in the tube wall for providing a fluid communication between the first tube and the gas channels in connection with the two or more nozzles.

7 Claims, 11 Drawing Sheets (56) References Cited

U.S. PATENT DOCUMENTS

| | | |
|---|---|---|
| 2007/0238311 A1 | 10/2007 | Levy |
| 2009/0081360 A1 | 3/2009 | Fedorovskaya et al. |
| 2010/0180819 A1 | 7/2010 | Hatanaka et al. |
| 2011/0023775 A1 | 2/2011 | Nunes et al. |
| 2011/0048325 A1 | 3/2011 | Choi et al. |
| 2011/0086167 A1 | 4/2011 | Nunes et al. |
| 2011/0120542 A1* | 5/2011 | Levy ................. C23C 16/45551 136/256 |
| 2012/0067971 A1* | 3/2012 | Byun ................ C23C 16/45591 239/106 |
| 2013/0149446 A1* | 6/2013 | Soininen ........... C23C 16/45551 427/248.1 |
| 2015/0007770 A1 | 1/2015 | Chandrasekharan et al. |

FOREIGN PATENT DOCUMENTS

| | | |
|---|---|---|
| WO | 2008085467 A1 | 7/2008 |
| WO | 2012028780 A1 | 3/2012 |

OTHER PUBLICATIONS

Written Opinion of the International Searching Authority issued by the Finnish Patent and Registration Office acting as the International Searching Authority in relation to International Application No. PCT/FI2019/050294 dated Jun. 24, 2019 (8 pages).

International Search Report issued by the Finnish Patent and Registration Office acting as the International Searching Authority in relation to International Application No. PCT/FI2019/050294 dated Jun. 24, 2019 (6 pages).

Supplementary European Search Report dated May 21, 2021, issued in corresponding European Application No. 19784418, 3 pages.

* cited by examiner

NOZZLE HEAD AND APPARATUS

CROSS-REFERENCE TO RELATED APPLICATIONS

This application is a continuation of PCT International Application No. PCT/FI2019/050294 filed Apr. 11, 2019, which claims priority to Finnish Patent Application No. 20185351, filed Apr. 12, 2018, the disclosure of each of these applications is expressly incorporated herein by reference in their entirety.

FIELD OF THE INVENTION

The present invention relates to a nozzle head for subjecting a surface of a substrate to successive surface reactions of at least two precursors according to the principles of atomic layer deposition and more particularly to a nozzle head for accomplishing the same. The present invention further relates to an apparatus for processing a surface of a substrate and more particularly to an apparatus for accomplishing the same.

BACKGROUND OF THE INVENTION

A nozzle head for subjecting a surface of a substrate to successive surface reactions of at least two precursors according to the principles of atomic layer deposition typically comprises several nozzles which supply two different precursors. These different precursors which are supplied from the nozzles are separated from each other by a purge gas flow typically supplied from a purge gas channel provided in a gap between adjacent precursor nozzles or from a separate purge gas nozzle. The purge gas is typically supplied from at least one point close to the end of the nozzle. A nozzle head also typically comprises nozzles that discharge precursors from an output face of the nozzle head. Gas arrangement for supplying precursor gas or purge gas or discharging gases requires many gas connections, piping and other connecting means in the nozzle head.

One of the problems associated with the prior art is that the gas arrangement in the nozzle head requires a lot of space for all the piping and gas connections. If the nozzle head is provided as a moving nozzle head there is also a danger that pipes may break when they are able move against each other.

BRIEF DESCRIPTION OF THE INVENTION

An object of the present invention is to provide an efficient and simple gas transportation to and from gas channels of a nozzle head and also outwards and inwards of the nozzle head.

The objects of the invention are achieved by a nozzle head and an apparatus which are characterized by what is stated in the independent claims. The preferred embodiments of the invention are disclosed in the dependent claims.

The invention is based on the idea of providing a common gas supply or discharge for the nozzle head.

The nozzle head according to the invention for subjecting a surface of a substrate to successive surface reactions of at least two precursors according to the principles of atomic layer deposition comprises a nozzle head body, a nozzle head output face, two or more nozzles supported to the nozzle head body, each of said two or more nozzles comprising a first side and a second side and a nozzle output surface, said two or more nozzles are arranged adjacent to each other such that the second side of one nozzle is towards the first side of an adjacent nozzle; and gas channels for transporting gas, said gas channels are provided in the two or more nozzles or between adjacent nozzles such that each gas channel comprises an opening in the nozzle head output face. The nozzle head further comprises a first through hole through at least two of the two or more nozzles, said first through hole is provided such that each of the at least two of the two or more nozzles comprise a first nozzle through hole extending between the first side and the second side of the nozzle and forming the first through hole through the at least two of the two or more nozzles; and a first tube having a tube wall. The first tube is fitted into the first through hole and said first tube comprises gas conduits provided in the tube wall for providing a fluid communication between the first tube and the gas channels in connection with the two or more nozzles.

The nozzle output surface is provided between a first end and a second end of the nozzle in a length direction of the nozzle output surface and between the first side and the second side of the nozzle in a width direction of the nozzle output surface. The nozzle is supported to the nozzle head body from its ends, i.e. from the first end and from the second end, which may form a protrusion or a recess for the connection to the nozzle head body. The two or more nozzles can be arranged adjacent to each other such that the sides of the adjacent nozzles are touching each other or there may be a gap between the adjacent nozzles. The gas channel may be provided in the gap between the adjacent nozzles or it may be provided in a nozzle. There are precursor nozzles and there may be a separate purge gas nozzle between adjacent precursor nozzles. In the case that the gas channel is provided as a gap between adjacent nozzles the gas opening is formed by the nozzles surrounding the gap and in the case, that the gas channel is provided in a nozzle the nozzle output surface comprises the gas opening. The first through hole through at least two of the two or more nozzles is preferably provided in the first end area or the second end area of the nozzle or in both ends of the nozzle. In another embodiment of the invention the first through hole is provided in the longitudinal direction of the nozzle to the middle part of the nozzle, the longitudinal direction being the direction between the first end and the second end. The first through hole is formed of multiple nozzle through holes that are provided in the nozzles such that they form a uniform first through hole through the nozzles.

The first tube is fitted into the first through hole in the nozzle head. The first tube comprises gas conduits for providing a fluid communication between the first tube to the gas channels in connection with the two or more nozzles and said gas conduits are formed in the first tube such that when the first tube is fitted into the first through hole the gas conduits are arranged in a fluid communication with the gas channels of the nozzle head. The size of the gas conduits in the first tube is preferably such that the total area of the gas conduits is smaller than the cross-sectional area of the first tube.

In one embodiment of the invention the gas channels are provided in the nozzle head such that the gas channels are in a form of a gap or a slot between adjacent nozzles and the gas conduits in the first tube are provided in a fluid communication with the gas channels provided between the adjacent nozzles.

In another embodiment of the invention the gas channels are provided in the nozzle head such that the gas channels are in the nozzles for example such that there is a purge gas nozzle for providing purge gas and comprising a purge gas channel inside the purge gas nozzle or that there is a precursor gas nozzle for providing precursor gas and comprising a precursor channel is arranged inside the precursor nozzle or that there is a discharge nozzle for discharging gases from a surface of a substrate via the nozzle head surface and comprising a discharge channel inside the discharge nozzle. The gas conduits in the first tube are provided in a fluid communication with the gas channels provided in connection with the nozzles and forming the gas openings in the nozzle output surfaces and preferably such that one gas channel is provided in one nozzle. The first tube comprises gas conduits such that preferably one gas conduit of the first tube is provided in a fluid communication with one gas channel.

The gas conduits in the first tube are preferably in a form of holes provided in the wall of the first tube. The first tube is preferably a rigid tube, such as a metal tube, as it also provides an alignment structure for the separate nozzles that are arranged as a planar structure in which planarity is important.

In another embodiment of the invention the nozzle head is curved and the first tube is preferably a flexible tube so that it is easily fitted into the first through hole which is also curved.

The nozzle head further comprises gaskets for preventing gas from the gas conduits of the first tube to flow into the nozzle through holes between the first tube and the nozzle through holes. The gaskets are provided such that at least one gasket is provided between the first nozzle through hole and the first tube. The gaskets are in a preferred embodiment of the invention provided such that they are on both sides of the gas conduit between the first tube and the nozzle through hole. The gaskets are preferably arranged around the first tube as O-ring gaskets.

The nozzle head further comprises a second through hole through at least two of the two or more nozzles. The second through hole is provided such that each of the at least two of the two or more nozzles comprise a second nozzle through hole extending between the first side and the second side of the nozzle and forming the second through hole through the at least two of the two or more nozzles. The nozzle head further comprise a second tube having a tube wall and being fitted into the second through hole. The second tube comprises gas conduits for providing a fluid communication between the second tube and an end gas channel which is preferably a purge gas channel. The end gas channel is preferably provided between the nozzle head body and the first end of the nozzles and/or between the nozzle head body and the second end of the nozzles. In another embodiment of the invention the second tube is arranged such that it supplies gas to the end gas channel provided in the nozzle such that the gas opening is in the end of the nozzle head surface in the first or in the second end of the nozzle or in both.

Each of said two or more nozzles comprise a first end and a second end such that the nozzle output surface is provided between the first end and the second end. In an embodiment of the invention the nozzle head further comprises two first through holes through the at least two of the two or more nozzles and two first tubes being fitted into the first through holes. The two first through holes are provided in the two or more nozzles such that one first through hole is provided in the proximity of the first end and the other first through hole is provided in the proximity of the second end of the nozzles. In another embodiment of the invention the nozzle head further comprises two second through holes through the at least two of the two or more nozzles and two second tubes being fitted into the second through holes. The two second through holes are provided in the two or more nozzles such that one second through hole is provided in the proximity of the first end and the other second through hole is provided in the proximity of the second end of the nozzles.

Similarly, as in connection with the first tubes, the gas conduits in the second tube are preferably in a form of holes in the wall of the second tube. The second tube is preferably a rigid tube, such as a metal tube, as it also provides an alignment structure for the separate nozzles that are arranged as a planar structure in which planarity is important.

In another embodiment of the invention the nozzle head is curved and the second tube is preferably a flexible tube so that it is easily fitted into the second through hole which is also curved.

The nozzle head further comprises gaskets for preventing gas from the gas conduits of the second tube to flow into the nozzle through holes between the second tube and the nozzle through holes. The gaskets are provided such that at least one gasket is provided between the second nozzle through hole and the second tube. The gaskets are in a preferred embodiment of the invention provided such that they are on both sides of the gas conduit between the second tube and the nozzle through hole. The gaskets are preferably arranged around the second tube as O-ring gaskets.

The apparatus according to the invention for processing a surface of a substrate comprises a nozzle head for subjecting the surface of the substrate to successive surface reactions of at least two precursors according to the principles of atomic layer deposition and a gas source connected to the nozzle head for supplying gas to the nozzle head. The nozzle head comprises a nozzle head body, a nozzle head output face, two or more nozzles supported to the nozzle head body, and gas channels for supplying gas toward the surface of the substrate. The gas source is connected to a first tube for supplying gas into said first tube, said first tube is fitted into a first through hole arranged to go through at least two of the two or more nozzles. The first tube comprises gas conduits for providing a fluid communication from the first tube to the gas channels in connection with the two or more nozzles.

The gas source is preferably connected to the first tube through a connection conduit connected to the gas source and forming a connection with a first end of the first tube such that the gas is supplied to the first tube from one end of the tube. In another embodiment of the invention the gas source is arranged to supply gas to both ends of the first tube such that gas is supplied to the first tube from the first end of the tube and/or from the second end of the first tube either simultaneously or non-simultaneously. In other words, the first tube comprises a first tube opening and a second tube opening, and said gas source is connected to both the first tube opening and the second tube opening for providing gas from both ends of the first tube via the first tube to the gas channels. Alternatively, the gas source is connected either to the first tube opening or the second tube opening such that the other tube opening not having the connection to the purge gas source is blocked or obstructed.

In another embodiment of the invention the gas source is further connected to a second tube fitted into a second through hole arranged to go through at least two of the two or more nozzles. The second tube comprises gas conduits for providing a fluid communication from the second tube to an end gas channel which said end gas channel is provided between the nozzle head body and the nozzles or in the nozzle between the nozzle output surface and the nozzle head body.

Each of the two or more nozzles comprise a first end and a second end such that the nozzle output surface is provided between the first end and the second end. The first side is extending between the first end and the second end and the second side is extending similarly between the first end and the second end. The nozzle head output face comprises the nozzle output surface.

In an embodiment of the invention the nozzle head further comprises two first through holes through the at least two of the two or more nozzles and two first tubes being fitted into the first through holes. The two first through holes are preferably provided in the two or more nozzles such that one first through hole is provided in the proximity of the first end of the nozzle and the other first through hole is provided in the proximity of the second end of the nozzle. The gas source is connected to the two first supply tubes. Further the nozzle head may comprise also two second through holes through the at least two of the two or more nozzles and two second tubes being fitted into the second through holes. The two second through holes are provided in the two or more nozzles such that one second through hole is provided in the proximity of the first end and the other second through hole is provided in the proximity of the second end of the nozzles. The gas source is connected to the two second tubes. The second through hole is preferably but not necessary in a height direction of the nozzle, i.e. the height direction is the direction between the nozzle output surface and the top surface of the nozzle head, closer to the nozzle output surface than the first through hole.

An advantage of the invention is that the amount of connections from the gas source to the gas channels in the nozzle head is drastically reduced. A further advantage of the invention is that the first and/or the second tube helps aligning nozzles in a planar nozzle head and the first and/or the second tube can be used for providing a proper spacing between the adjacent nozzles.

BRIEF DESCRIPTION OF THE DRAWINGS

The invention is described in detail by means of specific embodiments with reference to the enclosed drawings, in which.

DETAILED DESCRIPTION OF THE INVENTION

Figures 1A, 1B:
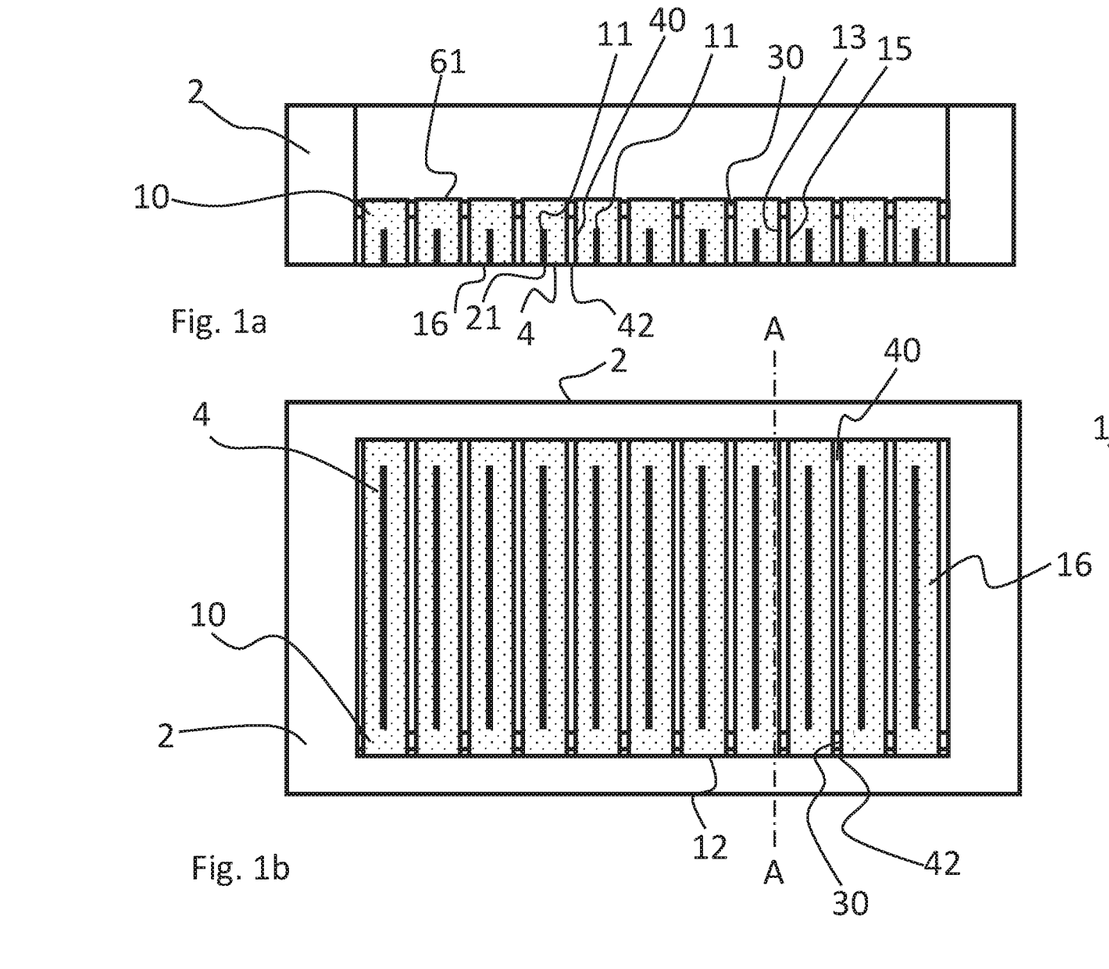
FIGS. 1a, 1b and 1c show one embodiment of a nozzle head according to the invention.

FIG. 1a shows schematically a cross-sectional end view of a nozzle head 1 for subjecting a surface of a substrate to successive surface reactions of at least two precursors according to the principles of atomic layer deposition. The nozzle head of FIGS. 1a, 1b and 1c have a planar nozzle head output face 4. Accordingly, this kind of nozzle head 1 may be moved in linear oscillating movement relative to the surface of the substrate between a first and second end positions. The nozzle head 1 may be arranged to supply one or more precursors via the nozzle head output face 4 towards a surface of a substrate. The nozzle head 1 comprises a body 2 and two or more nozzles 10. The nozzles 10 have a precursor supply channel 11 and/or discharge channel 17 for supplying precursor gas and/or discharging gases. The precursor supply channels 11 comprise a precursor supply opening 21 and the discharge channels 17 comprise a discharge opening 18 in the nozzle head output face 4. The nozzles 10 are provided in connection with the nozzle head output face 4 for supplying the at least one precursor, as shown in FIG. 1a. The nozzles 10 comprise nozzle output surface 16 which form the nozzle head output face 4. Two or more nozzles 10 are supported to the nozzle head body 2 and each of the two or more nozzles 10 comprise a first side 13 and a second side 15 and the nozzle output surface 16. The two or more nozzles 10 are arranged adjacent to each other such that the second side 15 of one nozzle 10 is towards the first side 13 of an adjacent nozzle 10. The nozzle head 1 further comprises purge gas channels 40 for supplying purge gas. The purge gas channels 40 comprise a purge gas opening 42 in the nozzle head output face 4. In the embodiment shown in FIG. 1a the purge gas channels 40 are provided between adjacent nozzles 10 and the purge gas opening is formed between adjacent nozzle output surfaces 16. The first tube 30 is shown in FIG. 1a for illustrative purposes. Normally, the first tube 30 is preferably provided in the nozzle head 1 such that the first tube 30 is fitted into the first through hole 20 and the gas conduits that provide a fluid communication between the first tube 30 and the gas channels may be arranged within the structures of the nozzle head 1 or the nozzles 10. The first tube 30 may be provided into a fluid communication with precursor supply channels 11, discharge channels 17 or purge gas channels 40.

FIG. 1b shows a schematic bottom view of the nozzle head 1 from the direction of the nozzle head output face 4. The nozzles 10 are arranged adjacently such that the first side 13 of one nozzle 10 is towards the second side 15 of adjacent nozzle 10 as shown in FIG. 1b. Accordingly, the nozzles 10 form at least part of the nozzle head output face 4. The nozzle head output face 4 is arranged towards the surface of the substrate at a predetermined distance such that a process gap is formed between the nozzle head output face 4 and the surface of the substrate during processing. The nozzle head output face 4 and the surface of the substrate are preferably conformal such that the shape of the nozzle head output face 4 and the shape of the surface of the substrate correspond each other for forming a uniform process gap. FIG. 1b shows further that the purge gas channels 40 in this embodiment are provided between adjacent nozzles 10 and the purge gas opening 42 is formed between adjacent nozzle output surfaces 16. The first supply tube 30 is in the embodiment shown in FIG. 1b provided in the proximity of the first end 12 of the nozzles 10.

Figure 1C:
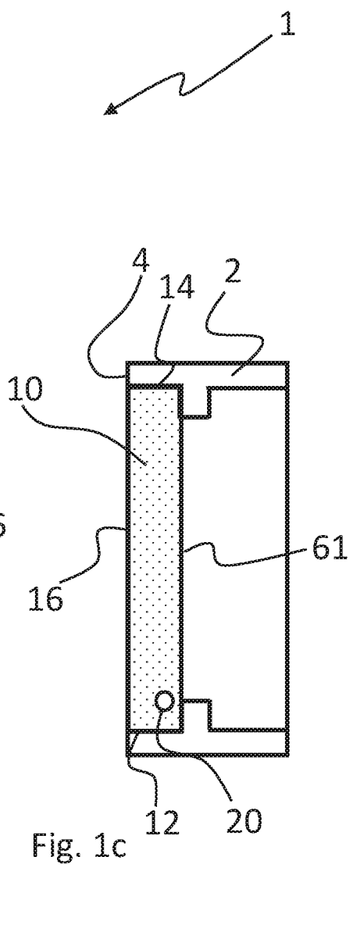

FIG. 1c shows schematically a cross-sectional side view of the nozzle head 1 along line A-A of FIG. 1b. The nozzle 10 is supported to the nozzle head body 2. The nozzles 10 are further provided to the nozzle head output face 4 such that the nozzle head output face 4 comprises nozzle output surfaces 16 and nozzles 10 may supply precursor gas or discharge gas via the nozzle head output face 4. The first through hole 20 is provided in the proximity of the first end 12 of the nozzles.

Figures 2A, 2B:
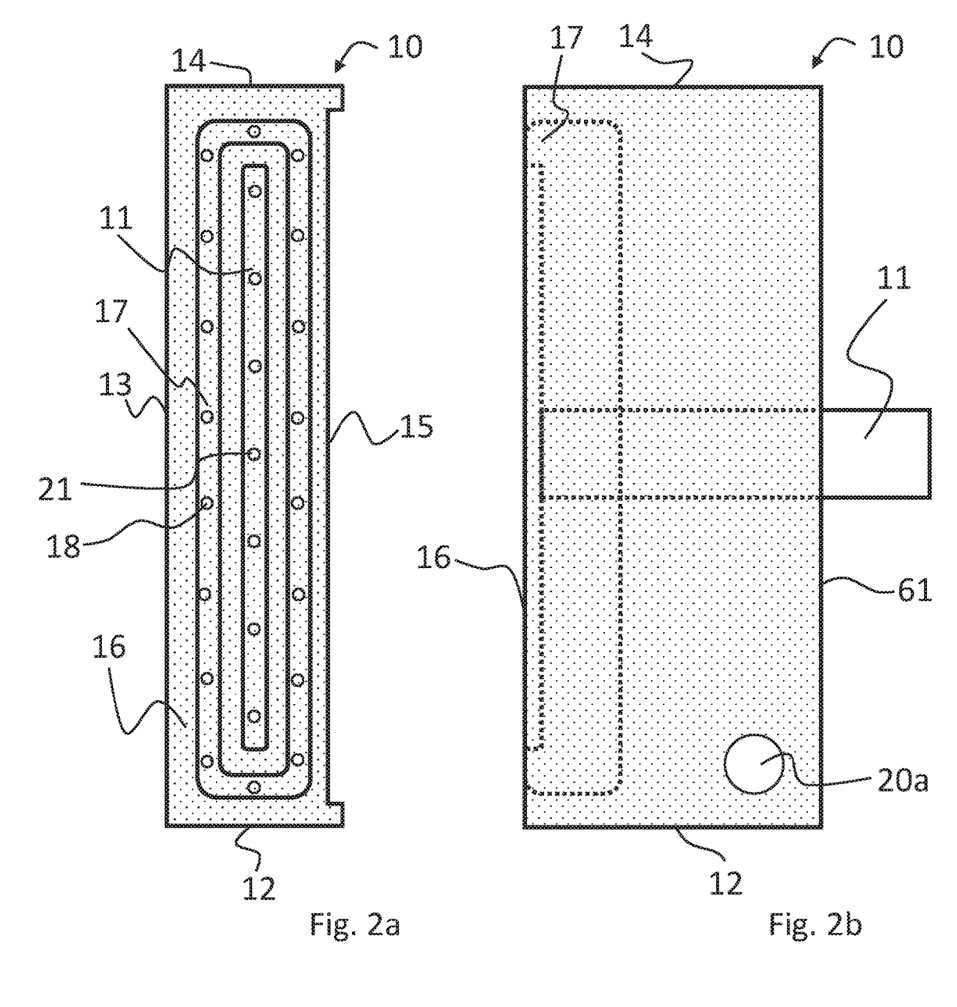
FIGS. 2a, 2b and 2c show an embodiment of a nozzle of the nozzle head.
Figure 2C:
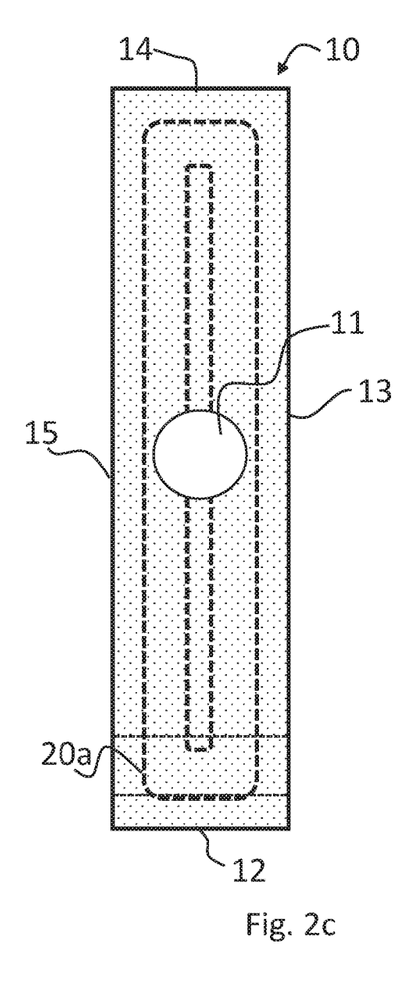

FIGS. 2a, 2b and 2c show an embodiment of a nozzle 10 of the nozzle head 1 in which FIG. 2a shows schematically a bottom view of a nozzle 10, FIG. 2b shows a side view of a nozzle 10 and FIG. 2c shows a top view of a nozzle 10. The nozzle 10 comprises a first end 12, a second end 14, a nozzle output surface 16, a nozzle top surface 61, a first side 13 and a second side 15. The nozzle output surface 16 and the nozzle top surface 61 are opposite to each other and extend between the first and second ends 12, 14 or on opposite sides of the nozzle 10. The first and second end 12, 14 comprise a first and second nozzle end surface, respectively. The first and second sides 13, 15 comprise first and second side surfaces, respectively. In the nozzle head 1, adjacent nozzles 10 are arranged such that the first side 13 of a nozzle 10 is towards a second side 15 of a first adjacent nozzle 10 and the second side 15 of the nozzle 10 is against a first side 13 of a second adjacent nozzle 10.

The nozzle output surface 16 comprises a channel or groove open to the nozzle output surface 16 and the precursor gas is supplied from the precursor supply channel 11 through the channel or groove in the nozzle output surface 16 toward a surface of a substrate. In this context, the precursor supply channel 11 is a channel extending through the nozzle 10 between the top surface 61 of the nozzle 10 and the nozzle output face 16. The precursor supply channel 11 is open to the nozzle output surface 16 and may comprise one or more precursor supply openings 21 from which the precursor gas may flow to the channel or groove. The nozzle 10 may further comprise a distribution channel inside the nozzle 10 for distributing the precursor gas to the one or more supply openings. The nozzle 10 may further comprise precursor conduit for supplying precursor gas into the nozzle 10 and to the distribution channel.

The nozzle 10 of FIGS. 2a and 2b comprises a discharge channel 17, which is a channel or a groove open to the nozzle output surface 16. The discharge channel 17 is arranged as a circumferential channel surrounding the precursor supply channel 11. The discharge channel 17 is provided with discharge openings 18 via which precursor gases and possible other gases may be discharged from the nozzle output surface 16. In an embodiment of the invention the discharge openings 18 are connected via discharge conduits and via a first tube 30 to a discharge arrangement such as a discharge device.

The nozzle 10 further comprises a recess 50 provided to the second side 15. The recess 50 extends through the nozzle from the top surface 61 to the nozzle output surface 16 for providing a gas passage from the top surface 61 to the nozzle output surface 16 when the second side 15 of the nozzle 10 is against a counter surface. The recess 50 may be grove or the like. The recess 50 extends along the whole thickness of the nozzle 10, or along the whole second side 15 in the direction perpendicular to the nozzle output surface 16, such that the recess 50 is open to the nozzle top surface 61 and the nozzle output surface 16. The recess 50 may also be provided such that it is only open to the nozzle output surface 16 and not to the top surface 61 of the nozzle 10.

It should be noted that the precursor supply channels 11, openings and conduits, discharge channels 17, openings and conduits as well as purge gas channels 40, openings and conduits may be formed and structured in several different ways and the present invention is not limited to them.

FIGS. 2b and 2c show a first nozzle through hole 20a extending from the first side 13 to the second side 15 of the nozzle 10. The first nozzle through hole 20a is part of the first through hole 20 extending through at least two of the two or more nozzles 10. In other words, the first through hole 20 extending through at least two of the two or more nozzles 10 is formed of multiple first nozzle through holes 20a that are aligned coaxially. The first nozzle through hole 20a is preferably provided in either or both end parts of the nozzle 10. The end part of the nozzle 10 meaning the proximity of the first or second end 12, 14 of the nozzle 10. Alternatively, the first nozzle through hole 20a may be provided in the middle part of the nozzle. In the embodiment shown in FIGS. 2a-2c the first tube 30 to be fitted into the first through hole 20 formed by first nozzle through holes 20a is to provide purge gas to a purge gas channel 40 formed of the recess 50 in the nozzle side 15 and the precursor gas and the discharge are provided by other means.

Figure 3:
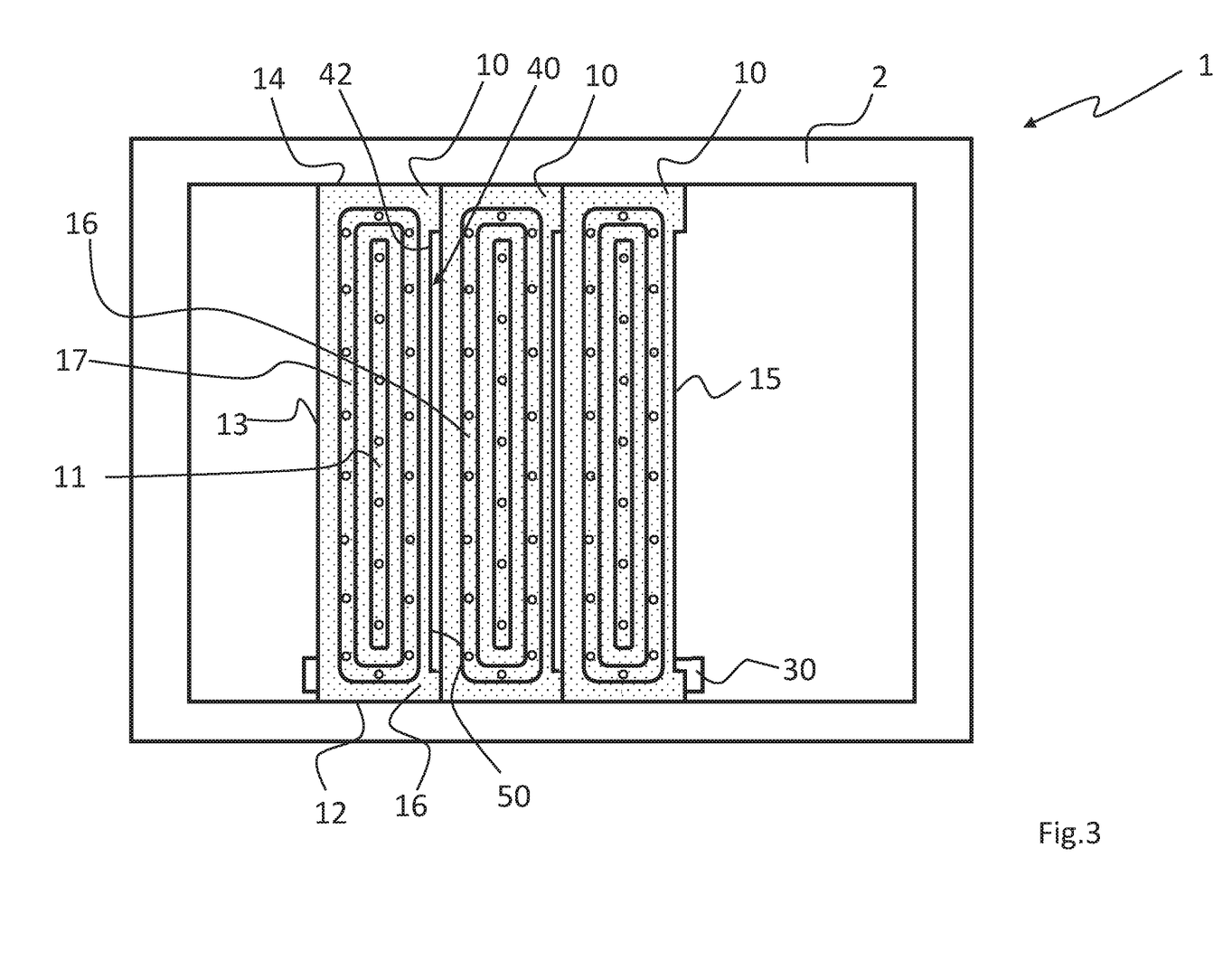
FIG. 3 shows an embodiment of a nozzle head.

FIG. 3 shows an embodiment of the nozzle head 1 according to the invention in which the nozzle sides 13, 15 of adjacent nozzles 10 are provided against each other and the recess 50 forms the purge gas channel 40 between the adjacent nozzles 10 such that the purge gas opening 42 is formed in the nozzle output surface 16. Accordingly, when the first nozzle side 13 is against the second nozzle side 15 of an adjacent nozzle 10, the recess 50 forms the purge gas channel 40 between the adjacent nozzles 10 and the purge gas opening 42 is formed between the adjacent nozzle output surfaces 16. As shown in FIG. 3 the first tube 30 is provided in the nozzle head 10 such that it is fitted into the first through hole 20 formed of the first nozzle through holes 20a. In this embodiment of the invention the first tube 30 may provide a fluid communication between the first tube 30 and the precursor supply channel 11 or between the first tube 30 and the discharge channel 17 or between the first tube 30 and purge gas channel 40.

Figure 4:
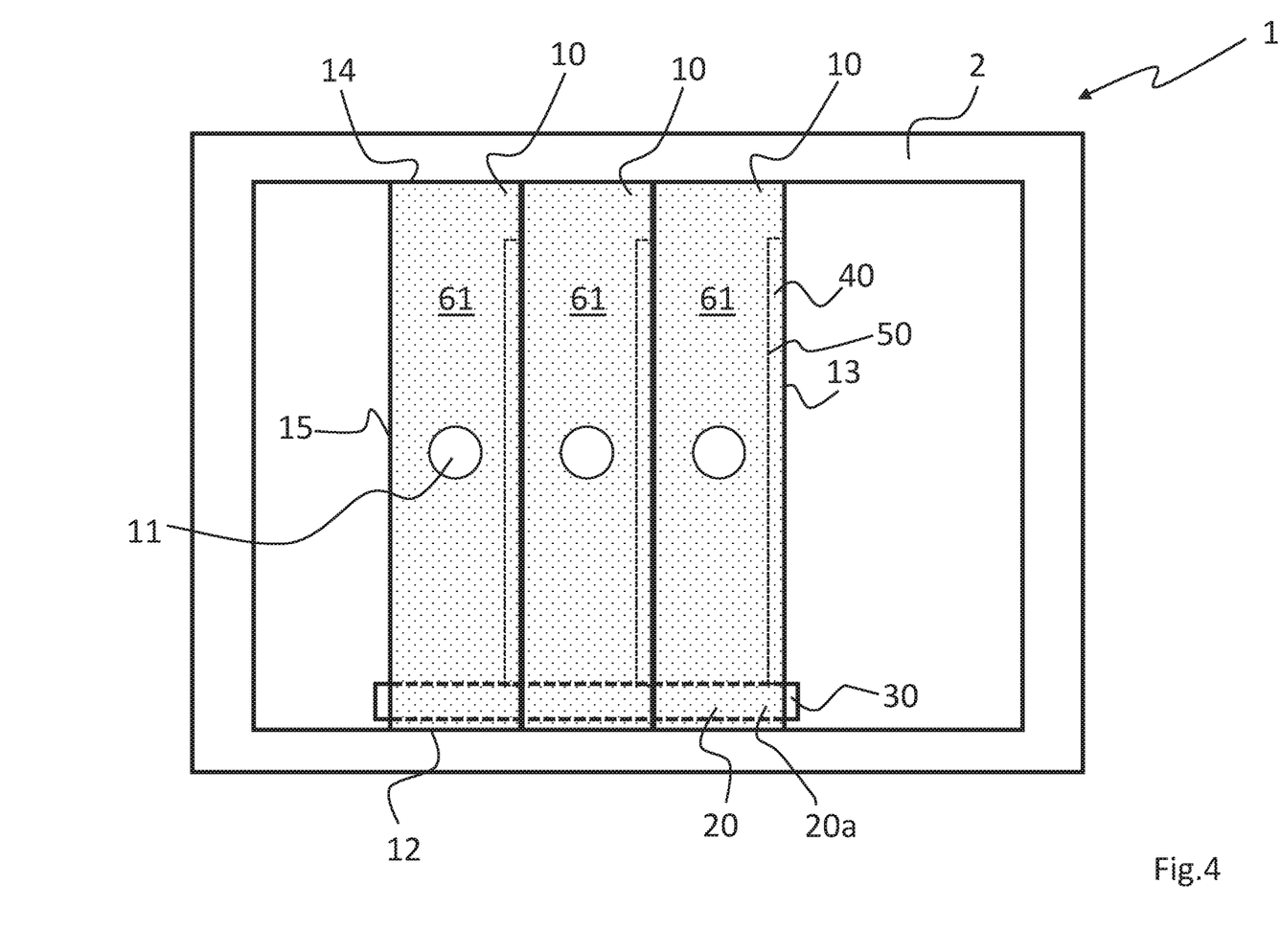
FIG. 4 shows an embodiment of a nozzle head.

FIG. 4 shows an embodiment of the nozzle head 1 according to the invention from the top side. In this embodiment, the purge gas channel 40 is provided as a channel between the adjacent nozzles 10 as a recess 50 as described in connection with the FIG. 3 but the recess 50 is not open to the top surface 61. The first tube 30 is fitted into the first through hole 20 formed from the first nozzle through holes 20a of adjacent nozzles 10. In this embodiment of the invention the first tube 30 is in fluid communication with the purge gas channel 40 through gas conduits in the first tube 30 and possible purge gas conduits extending in the nozzle structure as the recess 50 forming the purge gas channel 40 is not open to the top surface 61.

Figure 5A:
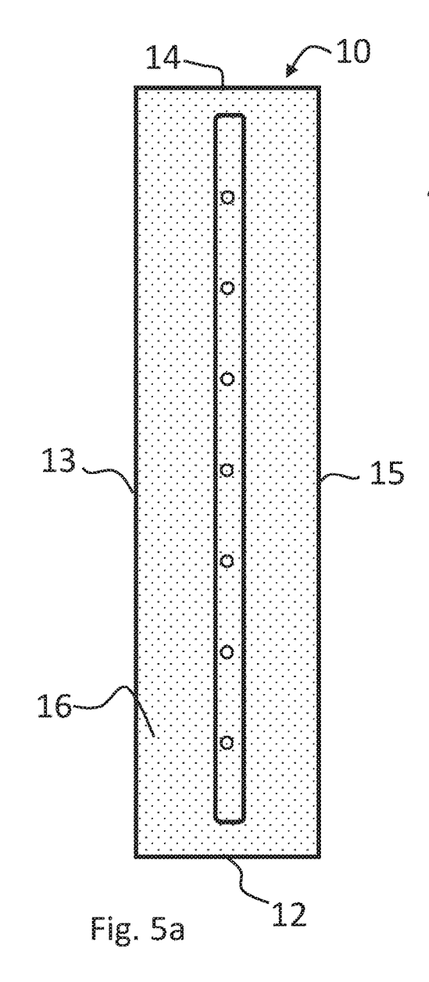
FIGS. 5a, 5b and 5c show an embodiment of a nozzle of the nozzle head.
Figure 5B:
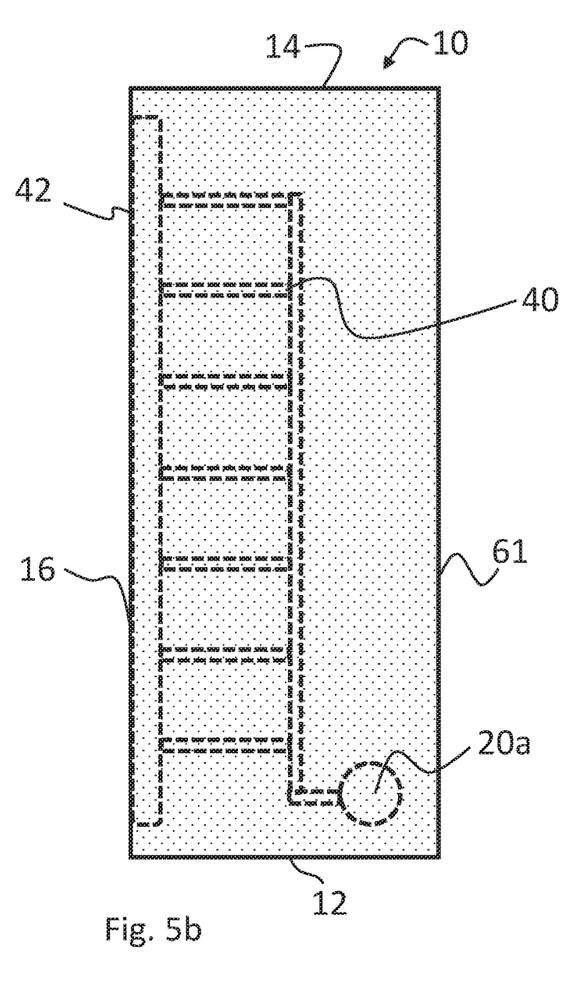
Figure 5C:
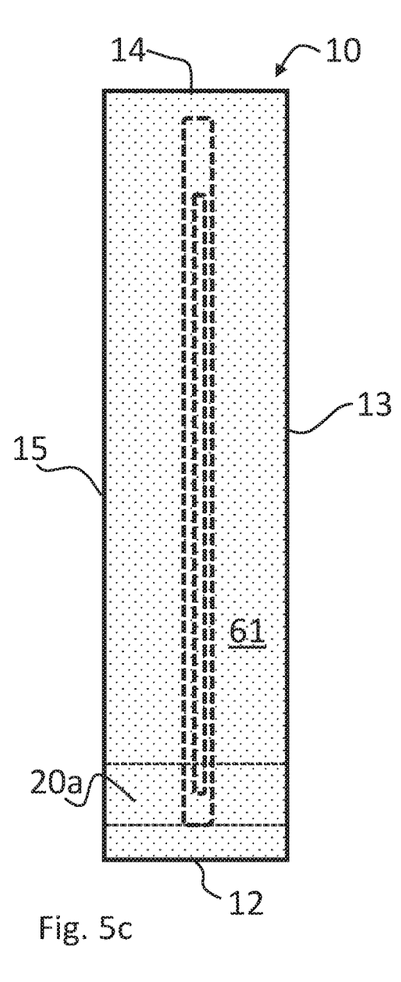

FIGS. 5a, 5b and 5c show an embodiment of a nozzle of a nozzle head according to the invention in which FIG. 5a shows schematically a bottom view of a nozzle 10, FIG. 5b shows a side view of a nozzle 10 and FIG. 5c shows a top view of a nozzle 10. The nozzle shown in FIGS. 5a, 5b and 5c is a purge gas nozzle arranged to provide purge gas to the surface of the substrate. The purge gas nozzle comprises similarly as the precursor nozzle described in connection with FIG. 2a a first end 12, a second end 14, a nozzle output surface 16, a nozzle top surface 61, a first side 13 and a second side 15. The nozzle output surface 16 and the nozzle top surface 61 are opposite to each other and extend between the first and second ends 12, 14 or on opposite sides of the nozzle 10. The purge gas channel 40 is provided inside the purge gas nozzle 10 and comprises distribution channels which all are commonly called as a purge gas channel 40. FIG. 5b shows that the first nozzle through hole 20a is connected to the purge gas channel 40 and FIG. 5c shows that the first nozzle through hole 20a extends from the first side 13 of the nozzle 10 to the second side 15 of the nozzle 10.

Figure 6:
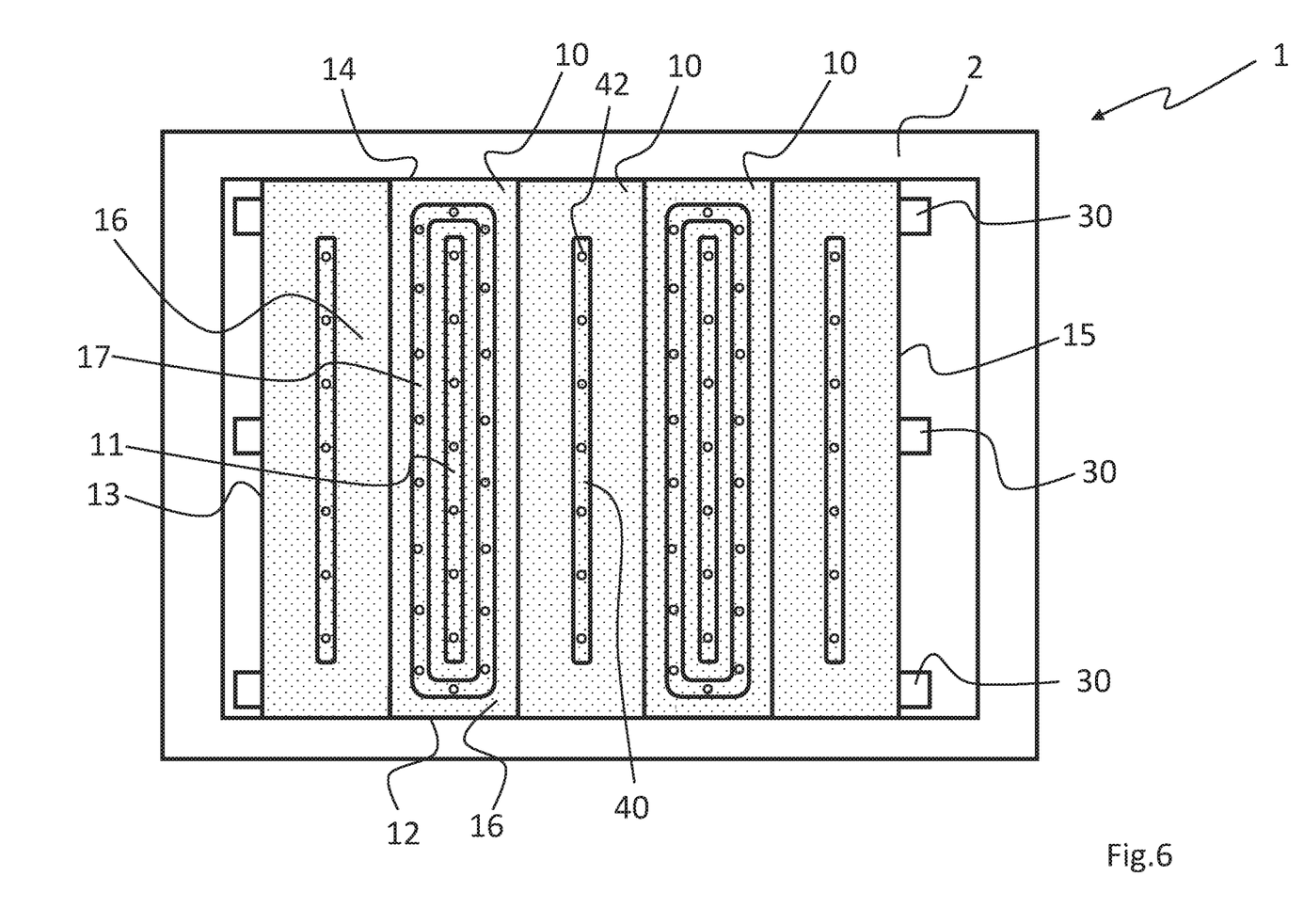
FIG. 6 shows an embodiment of a nozzle head.

FIG. 6 shows one embodiment of the nozzle head 1 according to the invention in which the nozzles 10 are provided adjacent to each other and every other nozzle is a purge gas nozzle comprising a purge gas channel 40 and purge gas opening 42 on the nozzle output surface 16 and every other nozzle is a precursor and/or discharge nozzle supplying precursor gas through a precursor supply channel 11 and/or discharging gases through discharge channel 17. The first tube 30 is fitted into the first through hole 20 and extending inside the nozzles 10. The nozzle head further comprises additional first tubes 30 provided in the nozzle head 1 such that one first tube 30 is arranged in the middle part of the nozzle head 1 and the other is on the opposite end of the nozzles 10 than the other first tube 30. One first tube 30 is arranged to provide fluid communication between the first tube 30 and the purge gas channel 40, the other first tube 30 is arranged to provide fluid communication with the precursor supply channel 11 and the yet another first tube 30 is arranged to provide fluid communication between the first tube 30 and the discharge channel 17.

Figure 7:
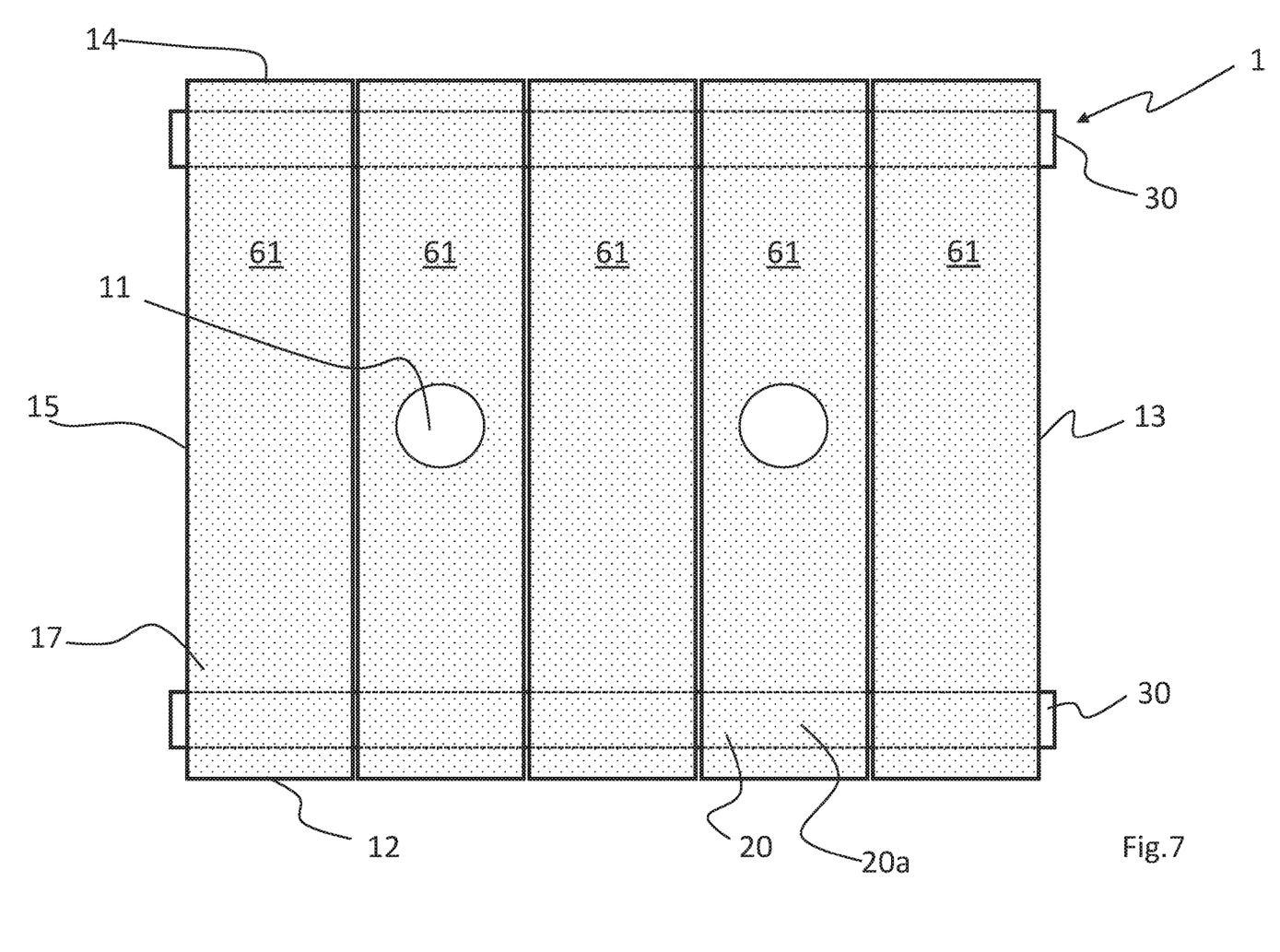
FIG. 7 shows an embodiment of a nozzle head.

FIG. 7 shows an embodiment of the nozzle head 1 shown from the top side in which there are two first tubes 30 provided in the end area of the nozzles 10 in the first through holes 20 formed of the first nozzle through holes 20a. The first tubes 30 are provided in a fluid communication with the discharge channels 17 and the purge gas channels 40 as the figure shows that a connection to the precursor supply channel 11 is on the upper side of the nozzle 10.

Figure 8A:
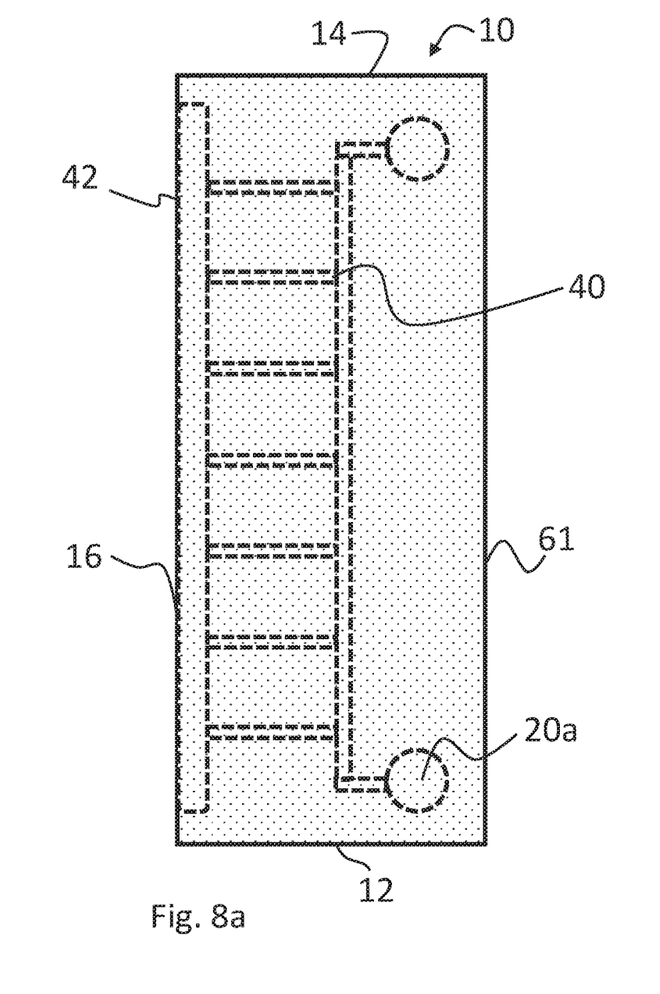
FIGS. 8a and 8b show an embodiment of a nozzle of the nozzle head.
Figure 8B:
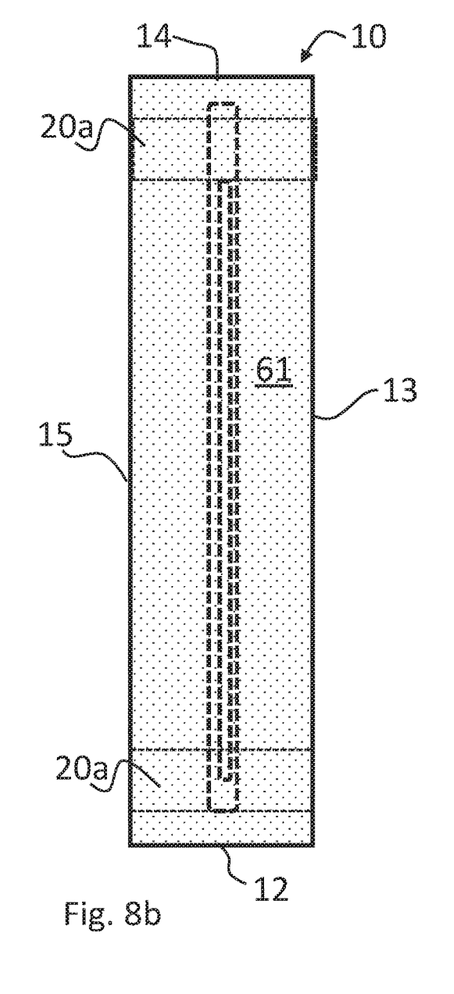

FIG. 8a shows an embodiment of a nozzle 10 as a side view and FIG. 8b shows the same nozzle as seen from top in which the nozzle comprises two first nozzle through holes 20a such that one first nozzle through hole 20a is in the proximity of the first end 12 of the nozzle 10 and the second first nozzle through hole 20a is in the proximity of the second end 14 of the nozzle 10. In this embodiment, the both first nozzle through holes 20a are connected to the same purge gas channel 40 such that when both first tubes 30 are fitted into the first holes 20 they both supply purge gas to the same purge gas channel 40.

Figure 9A:
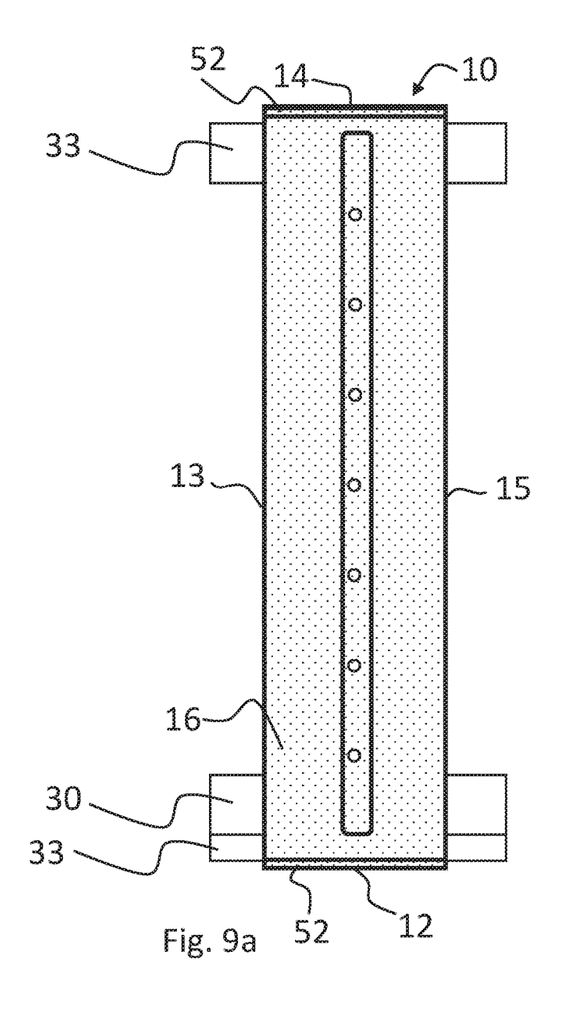
FIGS. 9a and 9b show an embodiment of a nozzle of the nozzle head.
Figure 9B:
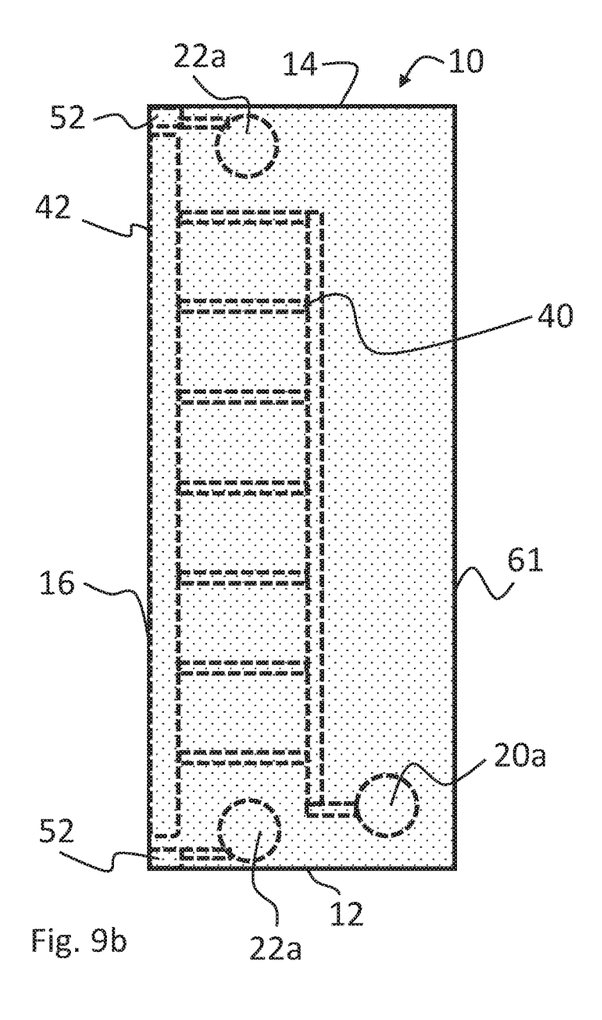

FIGS. 9a and 9b show an embodiment of the invention in which the nozzle 10 comprises one first nozzle through hole 20a and two second nozzle through holes 22a. These figures shown an example when the nozzle head 1 comprises an end purge gas channel 52 for providing purge gas flow which is parallel to the ends of the nozzle 10, i.e. an end purge gas channel 52 which is parallel to the first end 12 of the nozzle 10 and/or to the second end 14 of the nozzle 10. The end purge gas channel 52 may be formed between the nozzle head body 2 and the first ends 12 of the nozzles 10 and/or between the nozzle head body 2 and the second ends 14 of the nozzles 10 or it may be formed in the nozzles 10 such that the nozzles 10 comprise a nozzle end purge gas channel 52a forming together with adjacent nozzles 10 the end purge gas channel 52. The nozzle end purge gas channel 52a is provided in the nozzle 10 parallel with the first end 12 and/or with the second end 14 of the nozzle 10. The second nozzle through hole 22a is provided in the nozzle 10 for embodying a second tube 33 for supplying purge gas to the end purge gas channel 52 provided between the nozzle head body 2 and the nozzle 10 or for supplying purge gas to the nozzle end purge gas channel 52a provided in the nozzle 10. The embodiment of the invention shown in FIGS. 9a and 9b show the nozzle end purge gas channel 52 which is provided in the nozzle 10 such that it is formed in the first end 12 of the nozzle 10 and in the second end 14 of the nozzle 10.

Figure 10:
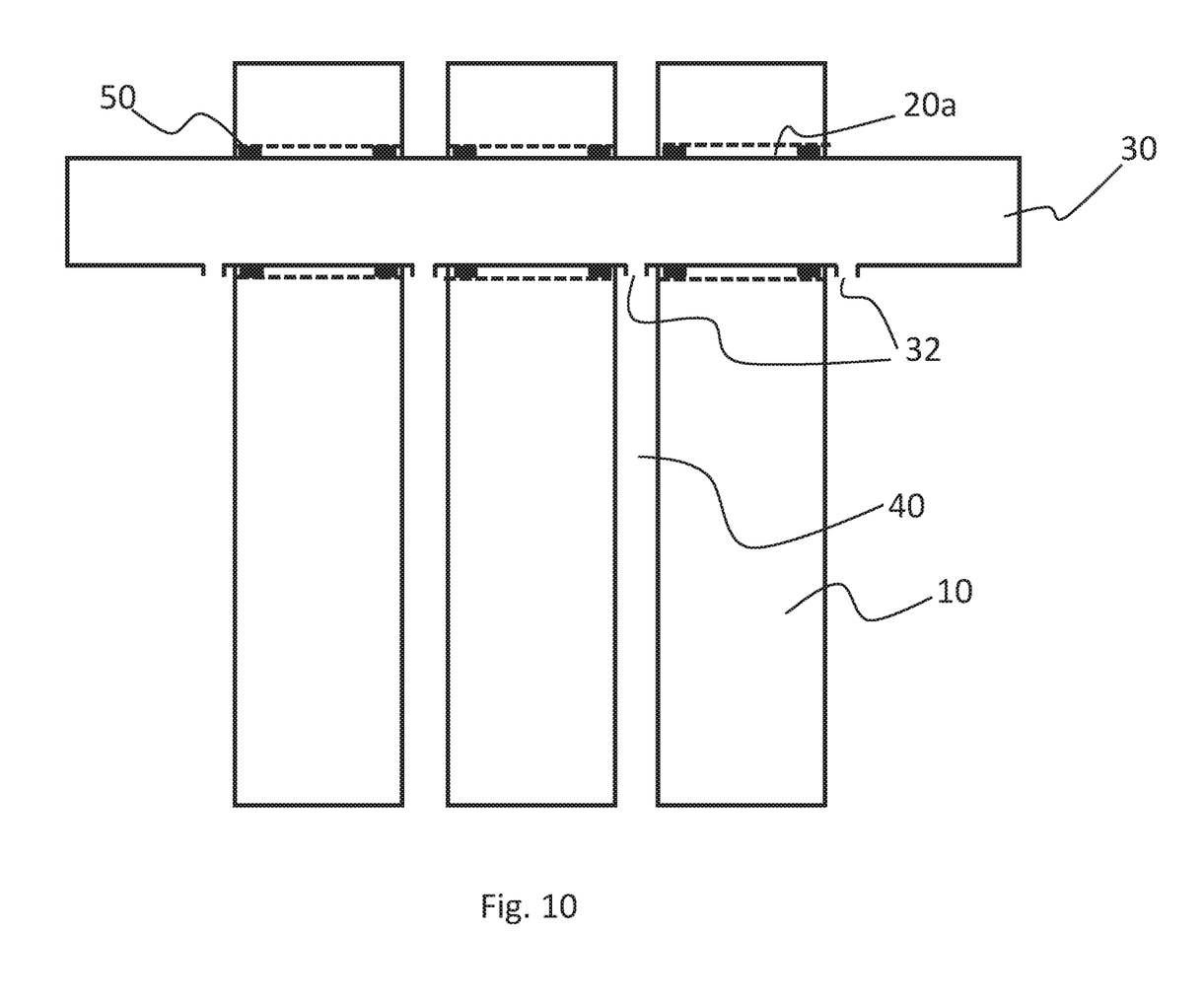
FIG. 10 shows a detail of a nozzle head.

FIG. 10 shows a detail of a first tube 30 which is similar as the second tube 33. The first tube 30 comprises gas conduits 32 preferably in a form of holes in the first tube 30. The gas conduits 32 are provided to the first tube 30 along the length of the first tube and preferably in a row. FIG. 10 shows schematically how the first tube 30 is fitted in a first through hole 20 formed of multiple nozzle through holes 20a and the gas conduits 32 form a fluid connection between the first tube and the purge gas channel 40 between adjacent nozzles 10. In this embodiment the nozzle head further comprises gaskets 50 for preventing purge gas from the gas conduits 32 of the first tube 30 to flow into the nozzle through holes 20a between the first tube 30 and the nozzle through holes 20a. The gaskets 50 are provided such that at least one gasket 50 is provided between the first nozzle through hole 20a and the first tube 30. In this embodiment the gaskets 50 are provided in such that they are arranged on both sides of the gas conduit 32 between the first through hole 20 and the first tube 30.

Figures 11A, 11B, 11C:
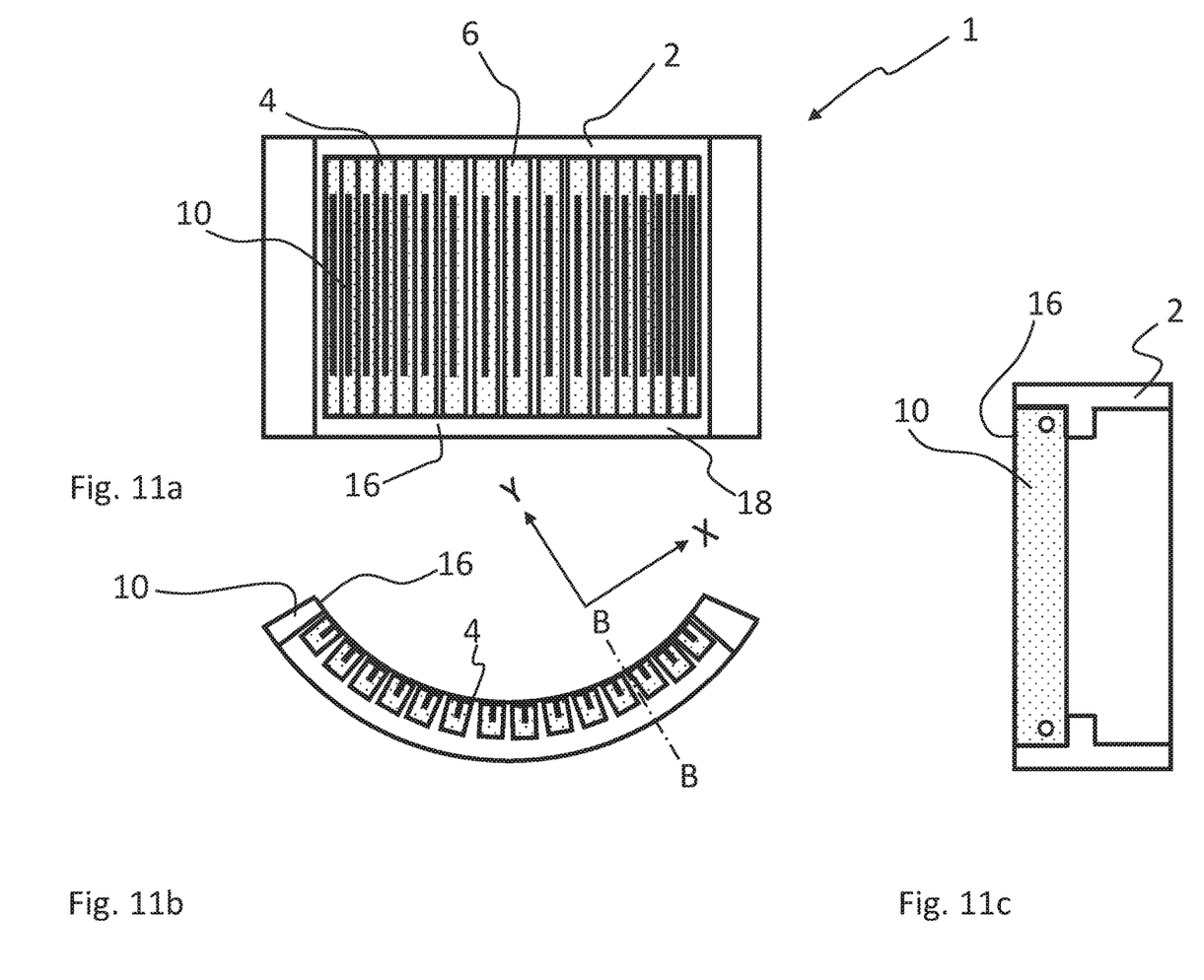
FIGS. 11a, 11b and 11c show another embodiment of a nozzle head according to the invention.

FIGS. 11a and 11b show schematically another embodiment of the nozzle head 1. FIG. 11a shows schematically bottom view of the nozzle head 1 in from the direction of the nozzle head output face 4. FIG. 11b shows a schematic cross sectional end view of the nozzle head 1. In this embodiment, the nozzle head comprises a curved output surface 4. The curved output surface 4 is curved in the direction between the first and second side structures. The curved output surface 4 has a curvature axis and the output surface 4 is circularly curved or is part of cylinder surface. In the embodiment of FIGS. 11a, 11b and 11c, the output surface 4 is provided as a concave surface. In another embodiment, the curved output surface may also be provided as convex surface. Furthermore, it should be noted that the curved output surface 4 may be preferable, but the present invention is not limited to only any special kind of output surface 4. Furthermore, it should be noted that the curved output surface may be smoothly curved or it consist of several planar portions arranged in an angle relative to each other. The latter may be provided for example with several nozzles having planar nozzle output surface.

The nozzles 10 are arranged adjacent to each other similarly as is FIGS. 1a, 1b and 1c. FIG. 11c shows schematically a cross-sectional side view of the nozzle head 1 along line B-B of FIG. 11b. The nozzle 10 is supported to the nozzle head body 2. The nozzle 10 is further provided to the curved output surface 4 such that the nozzle 10 may supply precursor gas or discharge gas via the output surface 4. Accordingly, the nozzle 10 is installed to the nozzle head 1 such that the nozzle output surface 16 forms at least part of the curved nozzle head output face 4.

The invention has been described above with reference to the examples shown in the figures. However, the invention is in no way restricted to the above examples but may vary within the scope of the claims.

The invention claimed is:

1. A nozzle head for subjecting a surface of a substrate to successive surface reactions of at least two precursors according to the principles of atomic layer deposition, the nozzle head comprising:
    a nozzle head body;
    a nozzle head output face;
    two or more nozzles supported to the nozzle head body, each of said two or more nozzles comprising a first side and a second side and a nozzle output surface, said two or more nozzles are arranged adjacent to each other such that the second side of one nozzle is towards the first side of an adjacent nozzle; and
    gas channels for transporting gas, said gas channels are provided in the two or more nozzles or between adjacent nozzles such that each gas channel comprises an opening in the nozzle head output face; wherein the nozzle head further comprises:

a first through hole through at least two of the two or more nozzles, said first through hole is provided such that each of the at least two of the two or more nozzles comprise a first nozzle through hole extending between the first side and the second side of the nozzle and forming the first through hole through the at least two of the two or more nozzles such that the first nozzle through hole of each of the at least two of the two or more nozzles are aligned coaxially;

a first tube having a first tube opening and a second tube opening provided at ends of the first tube and a tube wall extending between the ends, the first tube being fitted into the first through hole, said first tube comprising gas conduits in a form of holes provided in the tube wall for providing a fluid communication between the first tube and the gas channels between adjacent nozzles; and gaskets positioned between the first through hole and the first tube for preventing gas that flows through the first tube to flow from the gas conduits and into the first through hole.

2. A nozzle head according to claim 1, wherein said gas conduits in the first tube are provided in a fluid communication with the gas channels provided between the adjacent nozzles.

3. A nozzle head according to claim 1, wherein said gas conduits in the first tube are provided in a fluid communication with the gas channels provided in the two or more nozzles, said gas channels forming the openings in the nozzle output surface.

4. A nozzle head according to claim 2, wherein one gas conduit of the first tube is provided in a fluid communication with one gas channel.

5. A nozzle head according to claim 1, wherein size of the gas conduits in the first tube is such that the total area of the gas conduits is smaller than the cross-sectional area of the first tube.

6. An apparatus for processing a surface of a substrate, the apparatus comprising:

a nozzle head for subjecting the surface of the substrate to successive surface reactions of at least two precursors according to the principles of atomic layer deposition, the nozzle head comprising a nozzle head body, a nozzle head output face, two or more nozzles supported to the nozzle head body, and gas channels for supplying gas toward the surface of the substrate or for discharging gas from the surface of the substrate; and a gas source connected to the nozzle head for supplying gas to the nozzle head;

wherein the gas source is connected to a first tube for supplying gas into said first tube through a connection conduit connected to the gas source and forming a connection with a first end of the first tube such that the gas is supplied to the first tube from the first end of the first tube, said first tube is fitted into a first through hole arranged to go through at least two of the two or more nozzles, said first tube comprising gas conduits provided in a tube wall of the first tube for providing a fluid communication from the first tube to the gas channels between adjacent nozzles, wherein the nozzle head further includes gaskets positioned between the first through hole and the first tube for preventing gas that flows through the first tube to flow from the gas conduits and into the first through hole.

7. Apparatus according to claim 6, wherein the first tube comprises a first tube opening and a second tube opening, and said gas source is connected to both the first tube opening and the second tube opening for providing gas from both ends of the first tube via the first tube to the gas channels.

* * * * *